(12) United States Patent
Kamakura

(10) Patent No.: US 11,689,183 B2
(45) Date of Patent: Jun. 27, 2023

(54) RESONATOR DEVICE

(71) Applicant: Seiko Epson Corporation, Tokyo (JP)

(72) Inventor: Tomoyuki Kamakura, Matsumoto (JP)

(73) Assignee: SEIKO EPSON CORPORATION

( * ) Notice: Subject to any disclaimer, the term of this patent is extended or adjusted under 35 U.S.C. 154(b) by 0 days.

(21) Appl. No.: 17/721,431

(22) Filed: Apr. 15, 2022

(65) Prior Publication Data

US 2022/0337221 A1 Oct. 20, 2022

(30) Foreign Application Priority Data

Apr. 16, 2021 (JP) ................................. 2021-069524

(51) Int. Cl.
*H03H 9/17* (2006.01)
*H03B 5/30* (2006.01)
*H03H 9/13* (2006.01)

(52) U.S. Cl.
CPC ................ *H03H 9/17* (2013.01); *H03B 5/30* (2013.01); *H03H 9/13* (2013.01)

(58) Field of Classification Search
CPC ............... H03H 9/13; H03H 9/17; H03B 5/30
See application file for complete search history.

(56) References Cited

U.S. PATENT DOCUMENTS

2010/0314971 A1* 12/2010 Kaida ..................... H03H 9/17
310/344
2011/0074515 A1* 3/2011 Yoshida ............... H03H 9/0519
331/155
2016/0197595 A1 7/2016 Obata

FOREIGN PATENT DOCUMENTS

JP 2016-127469 A 7/2016

* cited by examiner

*Primary Examiner* — Jeffrey M Shin
(74) *Attorney, Agent, or Firm* — Harness, Dickey & Pierce, P.L.C.

(57) ABSTRACT

A resonator device includes: a base having a first surface and a second surface that are in front-back relation; a resonator element that is located at a first surface with respect to the base and that includes a resonation substrate and an electrode disposed at a surface of the resonation substrate on a base side; a conductive layer that is disposed at the first surface and that includes a joint portion joined to the electrode; and a stress relaxation layer that is interposed between the base and the conductive layer and that at least partially overlaps with the joint portion in a plan view of the base. The stress relaxation layer includes an exposed portion exposed from the conductive layer.

4 Claims, 10 Drawing Sheets

FIG. 3
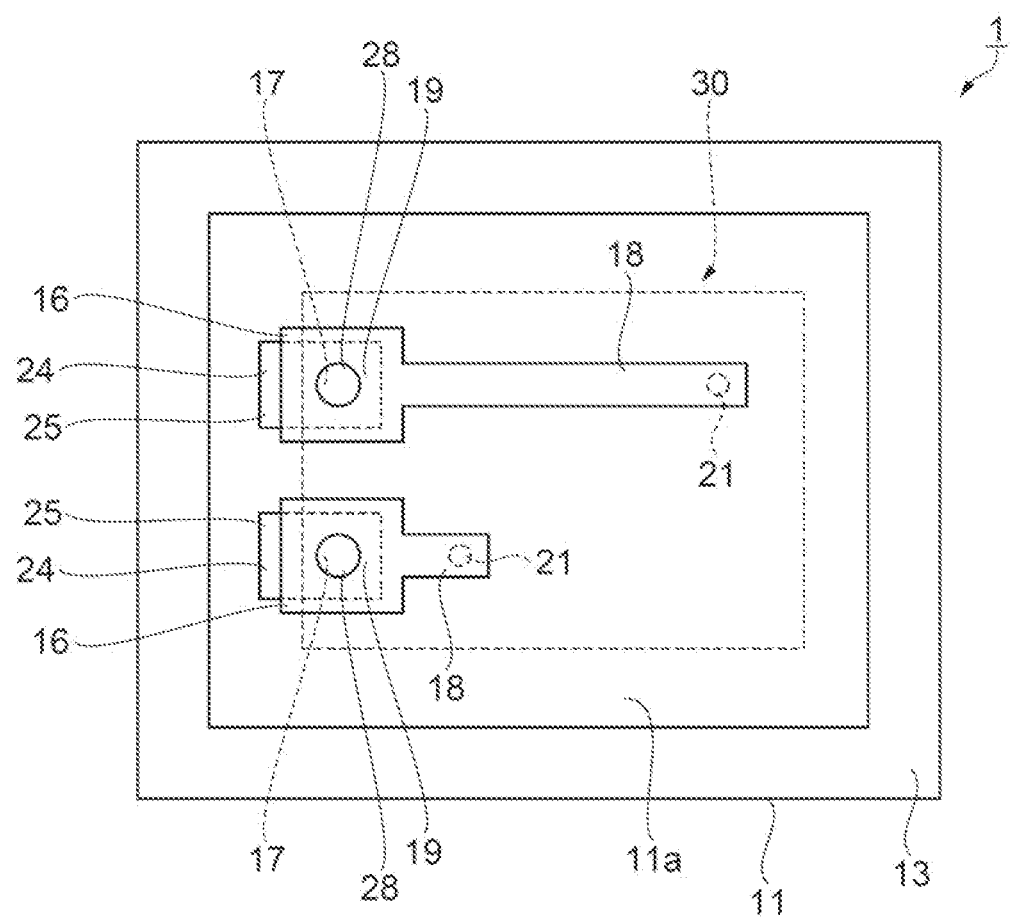
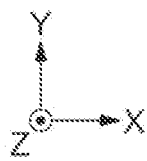

FIG. 10
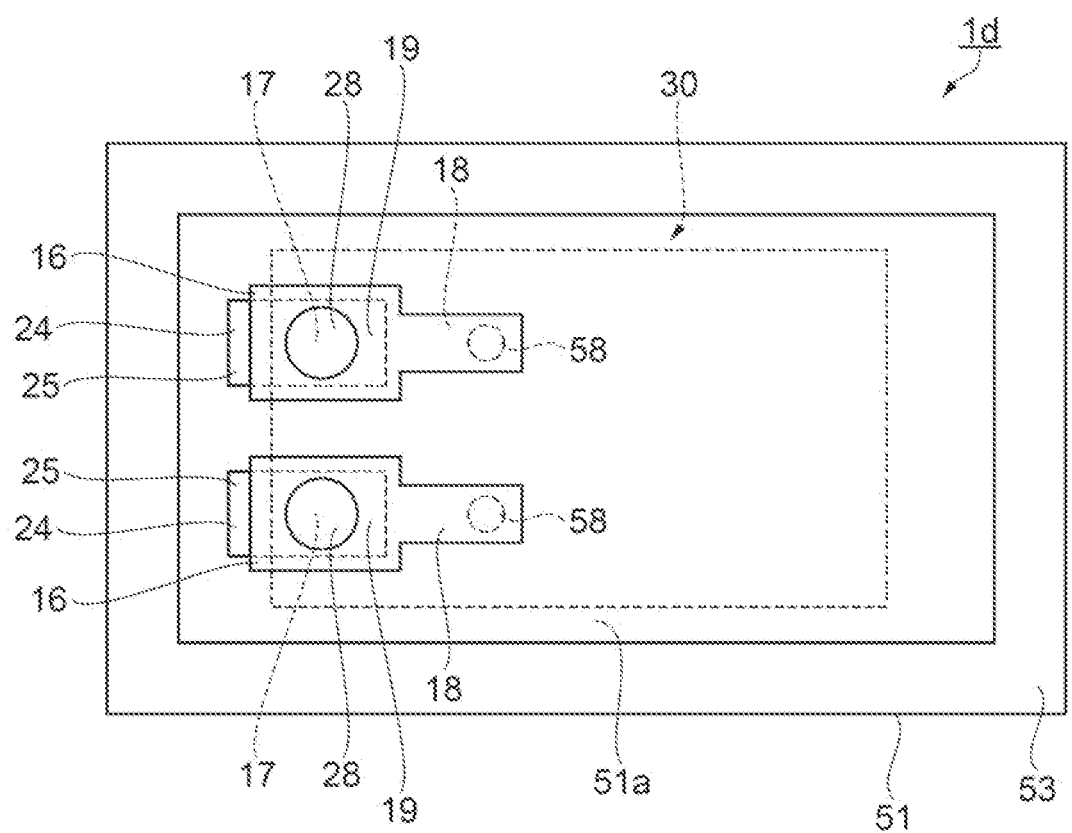
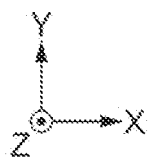

RESONATOR DEVICE

The present application is based on, and claims priority from JP Application Serial Number 2021-069524, filed Apr. 16, 2021, the disclosure of which is hereby incorporated by reference herein in its entirety.

BACKGROUND

1. Technical Field

The present disclosure relates to a resonator device.

2. Related Art

JP-A-2016-127469 discloses a quartz crystal resonator serving as a resonator device in which a quartz crystal resonator element is fixed to a package via a metal bump.

Since the metal bump has a high elastic modulus (Young's modulus) and is hard, the resonator device described in JP-A-2016-127469 is likely to be plastically deformed due to, for example, thermal stress caused by a difference in linear expansion coefficients between the quartz crystal resonator element and the package. When the metal bump is plastically deformed, unnecessary resonation or frequency hysteresis may be generated in the quartz crystal resonator element, and resonation characteristics may deteriorate.

SUMMARY

A resonator device includes: a base having a first surface and a second surface that are in front-back relation; a resonator element that is located at a first surface with respect to the base and that includes a resonation substrate and an electrode disposed at a surface of the resonation substrate on a base side; a conductive layer that is disposed at the first surface and that includes a joint portion joined to the electrode; and a stress relaxation layer that is interposed between the base and the conductive layer and that at least partially overlaps with the joint portion in a plan view of the base. The stress relaxation layer includes an exposed portion exposed from the conductive layer.

BRIEF DESCRIPTION OF THE DRAWINGS

FIG. 3 is a plan view showing a schematic structure of the resonator device.

FIG. 10 is a plan view showing a schematic structure of the resonator device according to the fifth embodiment.

DESCRIPTION OF EXEMPLARY EMBODIMENTS

1. First Embodiment

First, a resonator device 1 according to a first embodiment will be described with reference to FIGS. 1, 2, and 3.

Figure 1:
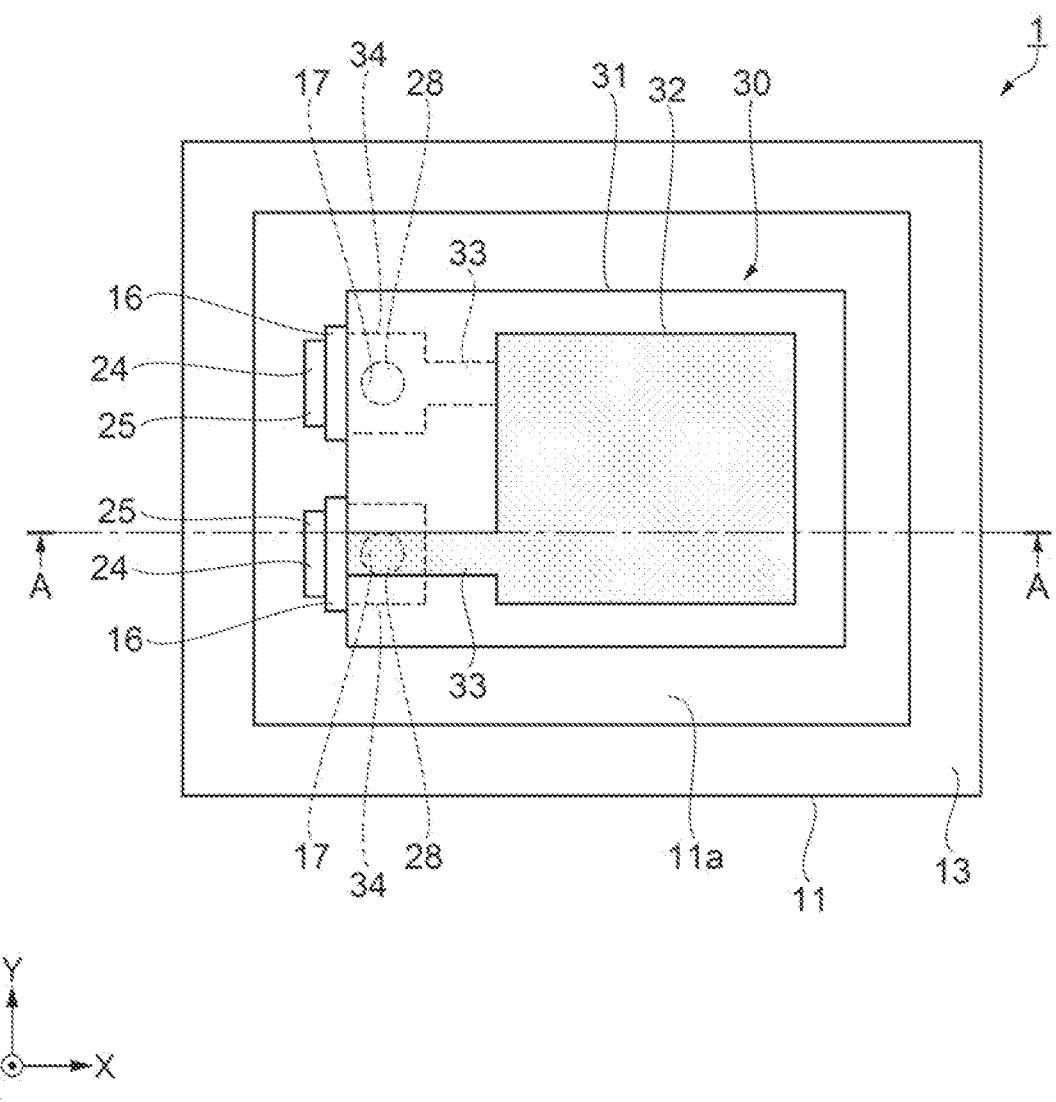
FIG. 1 is a plan view showing a schematic structure of a resonator device according to a first embodiment.

FIG. 1 shows a state in which a lid 12 is removed for convenience of description of an internal configuration of the resonator device 1. FIG. 3 shows a state in which the lid 12 and a resonator element 30 are removed for convenience of description of the internal configuration of the resonator device 1. For convenience of the description, in the following drawings, an X axis, a Y axis, and a Z axis are shown as three axes orthogonal to one another. A direction along the X axis is referred to as an "X direction", a direction along the Y axis is referred to as a "Y direction", and a direction along the Z axis is referred to as a "Z direction". An arrow side in each axis is also referred to as a "plus side", and an opposite side from the arrow is also referred to as a "minus side". A plus side in the Z direction is also referred to as "upper", and a minus side in the Z direction is also referred to as "lower". In the present embodiment, the X direction is a first direction, and the Y direction is a second direction.

Figure 2:
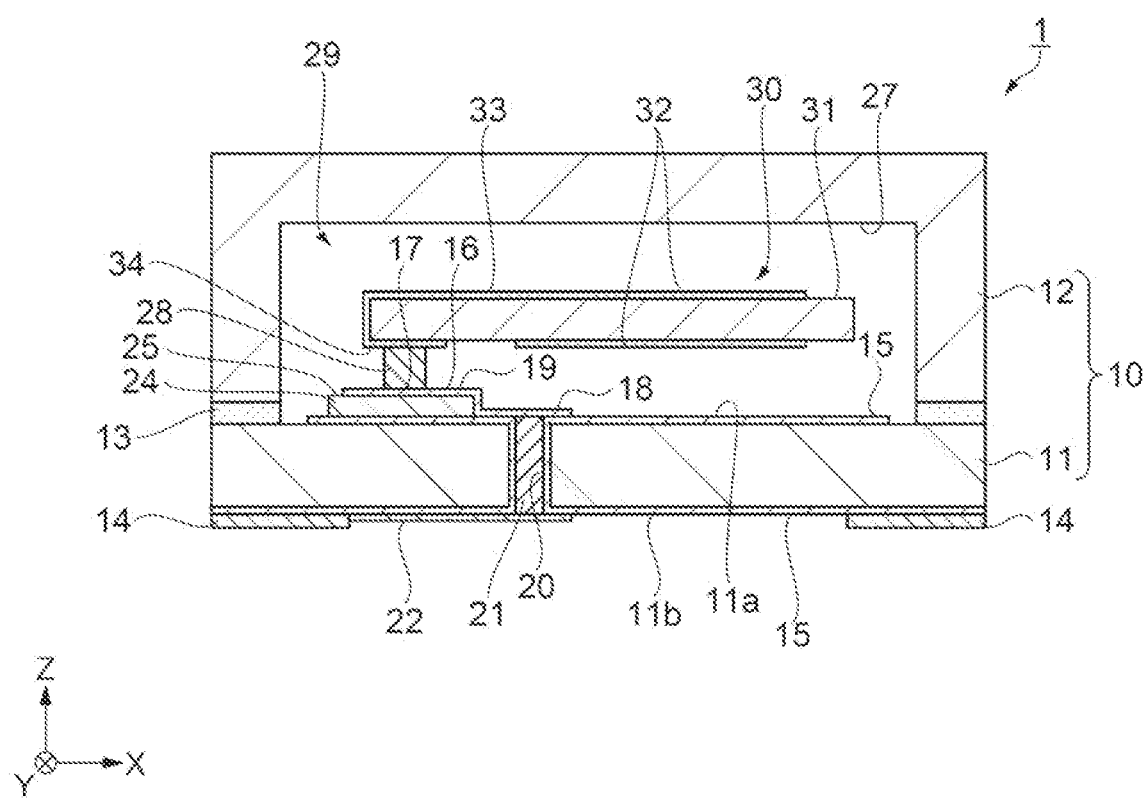
FIG. 2 is a cross-sectional view taken along a line A-A in FIG. 1.

As shown in FIGS. 1 and 2, the resonator device 1 includes a package 10 including a base 11 and the lid 12, and a resonator element 30 housed in an internal space 29 of the package 10.

The package 10 includes the base 11 and the lid 12 joined to the base 11, and the resonator element 30 is housed in the internal space 29 formed between the base 11 and the lid 12.

The base 11 is a semiconductor substrate containing single crystal silicon, particularly, a silicon substrate in the present embodiment. The base 11 is not particularly limited, and as the base 11, a semiconductor substrate other than the silicon substrate, for example, a semiconductor substrate such as a germanium substrate, a gallium arsenide substrate, a gallium phosphide substrate, a gallium nitride substrate, or a silicon carbide substrate may be used, or a substrate other than a semiconductor substrate such as a ceramic substrate may be used.

The base 11 is of a plate shape, and includes a first surface 11a at which the resonator element 30 is disposed, and a second surface 11b having front-back relation with the first surface 11a. Insulating films 15 are formed at surfaces of the base 11 excluding regions joined to the lid 12.

Conductive layers 16 and stress relaxation layers 24 are disposed at the first surface 11a of the base 11. The conductive layer 16 includes a joint portion 17 joined, via a conductive member 28 such as a metal bump, to an electrode 34 of a resonation substrate 31 of the resonator element 30 disposed at a surface on a base 11 side. The stress relaxation layer 24 is interposed between the base 11 and the conductive layer 16, and as shown in FIGS. 2 and 3, at least a part of the stress relaxation layer 24 overlaps with the joint portion 17 in a plan view of the base 11, that is, a plan view seen from the Z direction. Being disposed at the first surface 11a means being joined to the first surface 11a. Therefore, the stress relaxation layers 24, the conductive layers 16, the conductive members 28, and the electrodes 34 are laminated and joined in this order on the first surface 11a.

The conductive layer 16 includes a joint portion 17 which is a region joined to the conductive member 28, a wiring portion 18 disposed at the first surface 11a of the base 11, and a coupling portion 19 coupling the joint portion 17 and the wiring portion 18.

The stress relaxation layer 24 is formed of a resin material, and examples of the resin material are materials having heat resistance such as epoxy resin, acrylic resin, polyimide resin, and phenol resin. By interposing the stress relaxation layer 24, which has a smaller elastic modulus than the conductive layer 16 and the conductive member 28 and is soft, between the base 11 and the conductive layer 16, a high stress relaxation effect can be achieved, and it is possible to reduce generation of unnecessary resonation and frequency hysteresis and deterioration of resonation characteristics of the resonator element 30 due to plastic deformation of the conductive layer 16 and the conductive member 28 caused by a difference in linear expansion coefficients between the resonator element 30 and the package 10.

The stress relaxation layer 24 includes an exposed portion 25 exposed from the conductive layer 16 on the minus side in the X direction serving as the first direction in a plan view seen from the Z direction. Therefore, as compared with a case in which the entire stress relaxation layer 24 is covered with the conductive layer 16, it is possible to reduce cracks and disconnections in the conductive layer 16 due to deformation of the stress relaxation layer 24 that occurs in a case in which heat applied when the electrode 34 of the resonator element 30 and the conductive layer 16 are joined via the conductive member 28 cools.

In the present embodiment, the conductive layer 16 and the electrode 34 are joined via the conductive member 28, but the conductive layer 16 and the electrode 34 may be directly joined. In this case, the joint portion 17 of the conductive layer 16 refers to a region joined to the electrode 34.

The second surface 11b of the base 11 is formed with external terminals 14 electrically coupled to excitation electrodes 32 of the resonator element 30 via the electrodes 34, the conductive layers 16, and the like.

A pair of through holes 20 that penetrate the base 11 in a thickness direction are formed in the base 11. The through holes 20 are filled with a conductive material to form a through electrode 21. As shown in FIGS. 2 and 3, the conductive layer 16 electrically coupled to the resonator element 30 is disposed at the first surface 11a of the base 11. The conductive layer 16 is electrically coupled to the external terminal 14 via the through electrode 21 and a wiring 22 formed at the second surface 11b of the base 11. Therefore, by applying voltages from the external terminals 14, the resonator element 30 can be resonated via the excitation electrodes 32, and resonation signals can be output from the external terminals 14 to an outside.

The resonator element 30 housed in the internal space 29 is located at a first surface 11a side of the base 11, and includes the resonation substrate 31, the excitation electrodes 32 that resonate the resonation substrate 31, the electrodes 34 that output the resonation signals to the outside and that are disposed at the surface of the resonation substrate 31 on the base 11 side, and lead electrodes 33 that electrically couples the excitation electrodes 32 and the electrodes 34.

The resonator element 30 is disposed on the first surface 11a of the package 10 via the conductive members 28. As the resonation substrate 31, an AT-cut quartz crystal substrate, an SC-cut quartz crystal substrate, a BT-cut quartz crystal substrate, or the like is used.

The lid 12 is a silicon substrate like the base 11. Accordingly, linear expansion coefficients of the base 11 and the lid 12 are equal to each other, generation of thermal stress due to thermal expansion is reduced, and the resonator device 1 has excellent resonation characteristics. Since the resonator device 1 can be formed by a semiconductor process, the resonator device 1 can be manufactured with high accuracy and can be miniaturized. However, the lid 12 is not particularly limited, and a semiconductor substrate other than the silicon substrate, for example, a semiconductor substrate such as a germanium substrate, a gallium arsenide substrate, a gallium phosphide substrate, a gallium nitride substrate, or a silicon carbide substrate may be used as the lid 12. For example, a substrate other than a semiconductor substrate such as a metal substrate such as Kovar, and a glass substrate can be used.

The lid 12 is open to the base 11 side and has a bottomed recess 27 for housing the resonator element 30 inside. Further, a lower surface of the lid 12 is joined to the base 11 via a joining member 13. Accordingly, the lid 12 forms, together with the base 11, the internal space 29 for housing the resonator element 30. As a joining method of the base 11 and the lid 12, a joining method such as diffusion joining using diffusion of metals contained in the base 11 and the lid 12 instead of using the joining member 13 may be used.

The internal space 29 is airtight and is in a depressurized state, preferably a state closer to vacuum. Accordingly, viscous resistance is reduced, and oscillation characteristics of the resonator element 30 are improved. However, an atmosphere of the internal space 29 is not particularly limited, and may be, for example, an atmosphere in which an inert gas such as nitrogen or argon is sealed, or may be an atmospheric pressure state or a pressurized state instead of the depressurized state.

As described above, since the resonator device 1 according to the present embodiment is disposed with the stress relaxation layer 24, which has the smaller elastic modulus than the conductive layer 16 and the conductive member 28 and is soft, between the base 11 and the conductive layer 16, a high stress relaxation effect can be achieved, and it is possible to reduce the generation of the unnecessary resonation and the frequency hysteresis and the deterioration of the resonation characteristics of the resonator element 30 due to the plastic deformation of the conductive layer 16 and the conductive member 28 caused by the difference in the linear expansion coefficients between the resonator element 30 and the package 10.

Since the stress relaxation layer 24 includes the exposed portion 25 exposed from the conductive layer 16, as compared with the case in which the entire stress relaxation layer 24 is covered with the conductive layer 16, it is possible to reduce the disconnection due to peeling and the cracks caused by decrease in a degree of adhesion between the conductive layer 16 and the stress relaxation layer 24. The decrease in the degree of adhesion is due to the deformation of the stress relaxation layer 24. The deformation of the stress relaxation layer 24 occurs in a case in which the heat applied when the electrode 34 of the resonator element 30 and the conductive layer 16 are joined via the conductive member 28 cools.

2. Second Embodiment

Figure 4:
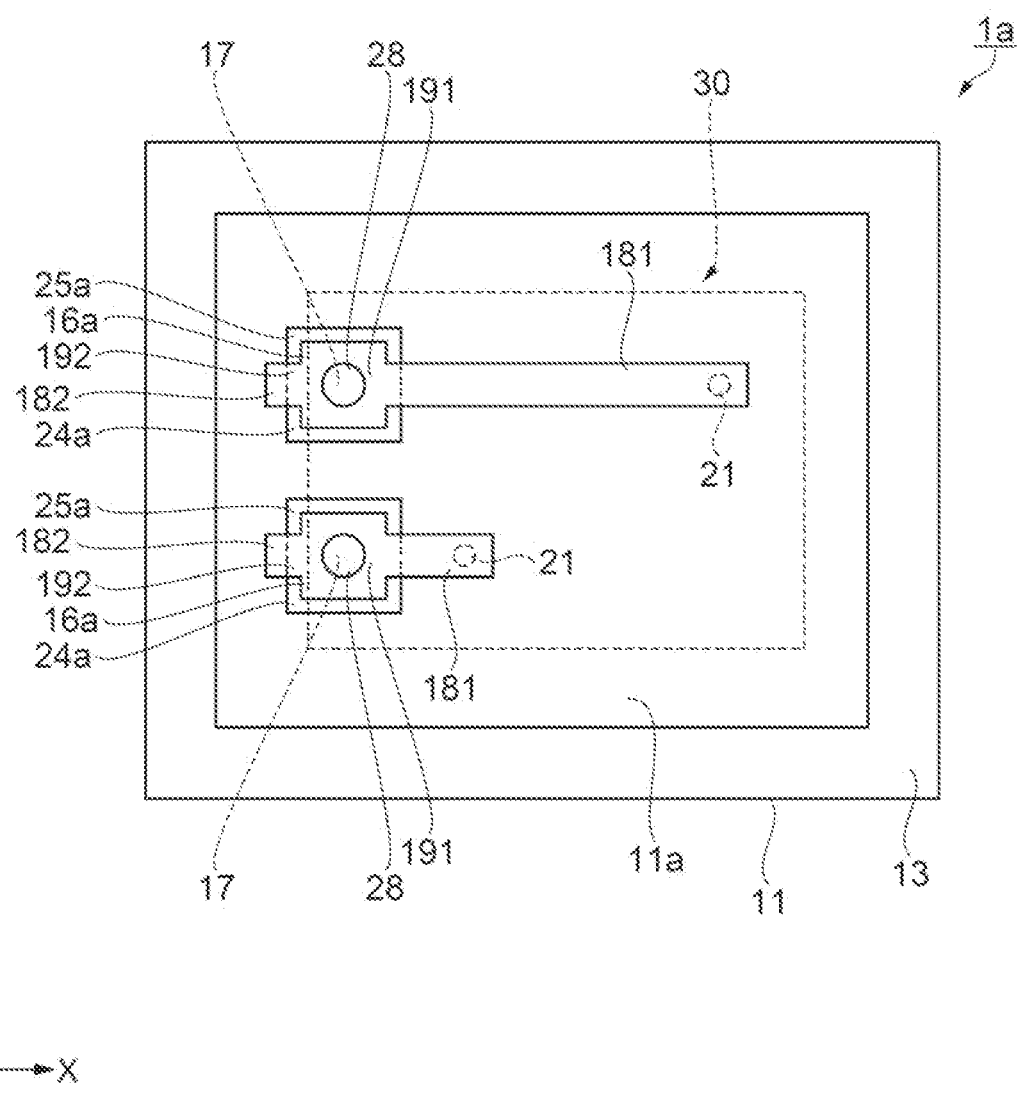
FIG. 4 is a plan view showing a schematic structure of a resonator device according to a second embodiment.

Next, a resonator device 1a according to a second embodiment will be described with reference to FIG. 4. FIG. 4 shows a state in which the lid 12 and the resonator element 30 are removed for convenience of description of an internal configuration of the resonator device 1a.

As compared to the resonator device 1 according to the first embodiment, the resonator device 1a according to the present embodiment is the same as the resonator device 1 according to the first embodiment except that the resonator device 1a includes first coupling portions 191 and second coupling portions 192 extending from the joint portions 17 of conductive layers 16a to the plus side and the minus side in the X direction serving as the first direction, respectively, and that exposed portions 25a of stress relaxation layers 24a are located on both sides of the joint portions 17 in the Y direction. Differences from the first embodiment described above will be mainly described, the same elements will be denoted by the same reference numerals, and description thereof will be omitted.

As shown in FIG. 4, the resonator device 1a includes the first coupling portions 191 that extend from the joint portions 17 of the conductive layers 16a to the plus side in the X direction and that are coupled to first wiring portions 181, and the second coupling portions 192 that extend from the joint portions 17 of the conductive layers 16a to the minus side in the X direction and that are coupled to second wiring portions 182. The exposed portions 25a of the stress relaxation layers 24a are located at both sides of the joint portions 17 in the Y direction.

With such a configuration, a degree of adhesion between the conductive layer 16a and the stress relaxation layer 24a can be improved, and the same effect as that of the resonator device 1 according to the first embodiment can be achieved.

3. Third Embodiment

Figure 5:
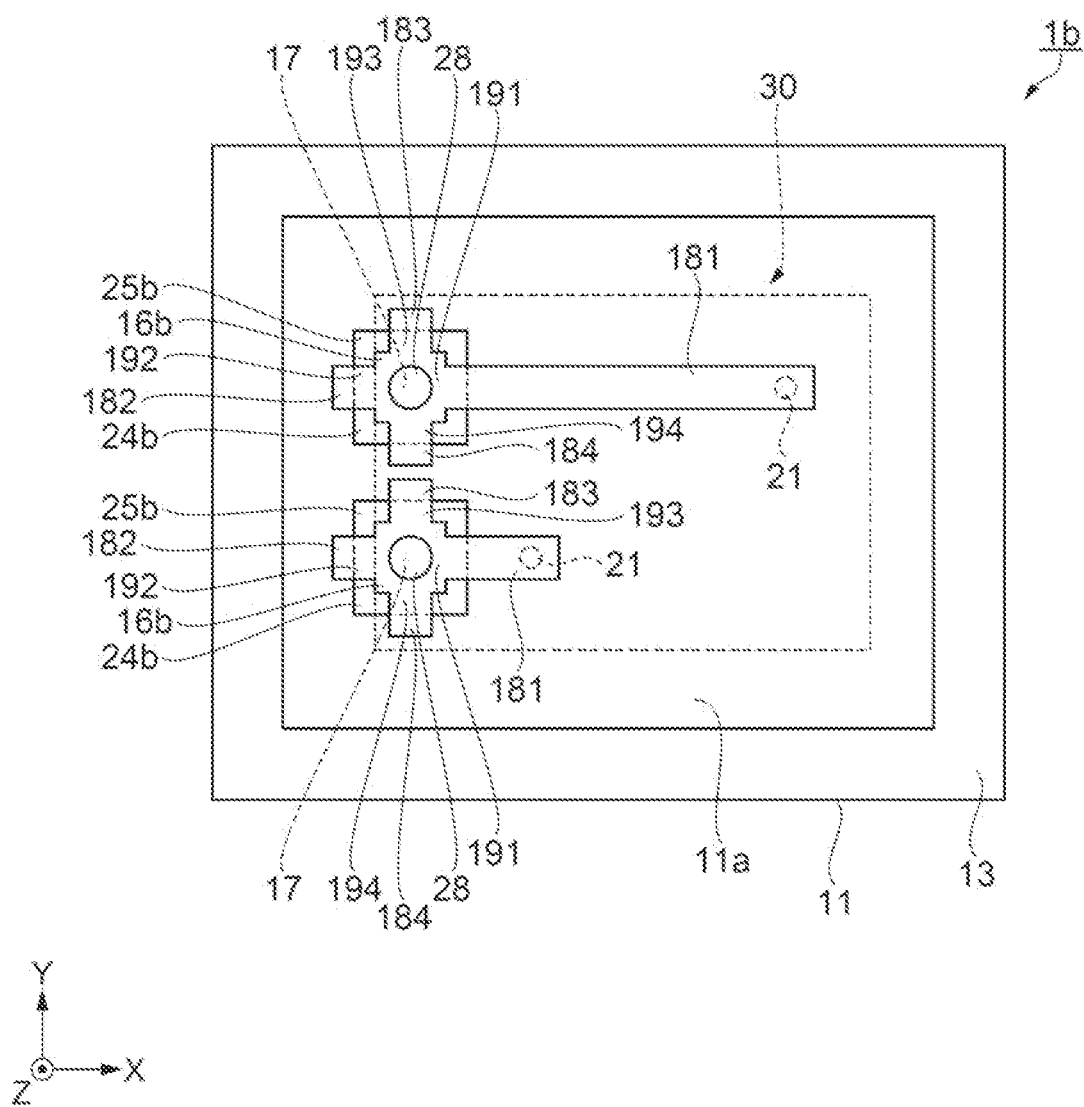
FIG. 5 is a plan view showing a schematic structure of a resonator device according to a third embodiment.

Next, a resonator device 1b according to a third embodiment will be described with reference to FIG. 5. FIG. 5 shows a state in which the lid 12 and the resonator element 30 are removed for convenience of description of an internal configuration of the resonator device 1b.

As compared to the resonator device 1 according to the first embodiment, the resonator device 1b according to the present embodiment is the same as the resonator device 1 according to the first embodiment except that the resonator device 1b includes the first coupling portions 191 and the second coupling portions 192 extending from the joint portions 17 of conductive layers 16b to the plus side and the minus side in the X direction serving as the first direction, respectively, and third coupling portions 193 and fourth coupling portions 194 extending from the joint portions 17 of the conductive layers 16b to the plus side and the minus side in the Y direction serving as the second direction intersecting the first direction, respectively, and that exposed portions 25b of the stress relaxation layers 24b are located at four corners of upper surfaces of the stress relaxation layers 24b. Differences from the first embodiment described above will be mainly described, the same elements will be denoted by the same reference numerals, and description thereof will be omitted.

As shown in FIG. 5. the resonator device 1b includes the first coupling portions 191 that extend from the joint portions 17 of the conductive layers 16b to the plus side in the X direction and that are coupled to the first wiring portions 181, the second coupling portions 192 that extend from the joint portions 17 of the conductive layers 16b to the minus side in the X direction and that are coupled to the second wiring portions 182, the third coupling portions 193 that extend from the joint portions 17 of the conductive layers 16b to the plus side in the Y direction and that are coupled to third wiring portions 183, and the fourth coupling portions 194 that extend from the joint portions 17 of the conductive layers 16b to the minus side in the Y direction and that are coupled to fourth wiring portions 184. The exposed portions 25b of the stress relaxation layers 24b are located at the four corners of the upper surfaces of the stress relaxation layers 24b.

With such a configuration, a degree of adhesion between the conductive layer 16b and the stress relaxation layer 24b can be further improved, and the same effect as that of the resonator device 1 according to the first embodiment can be achieved.

4. Fourth Embodiment

Figure 6:
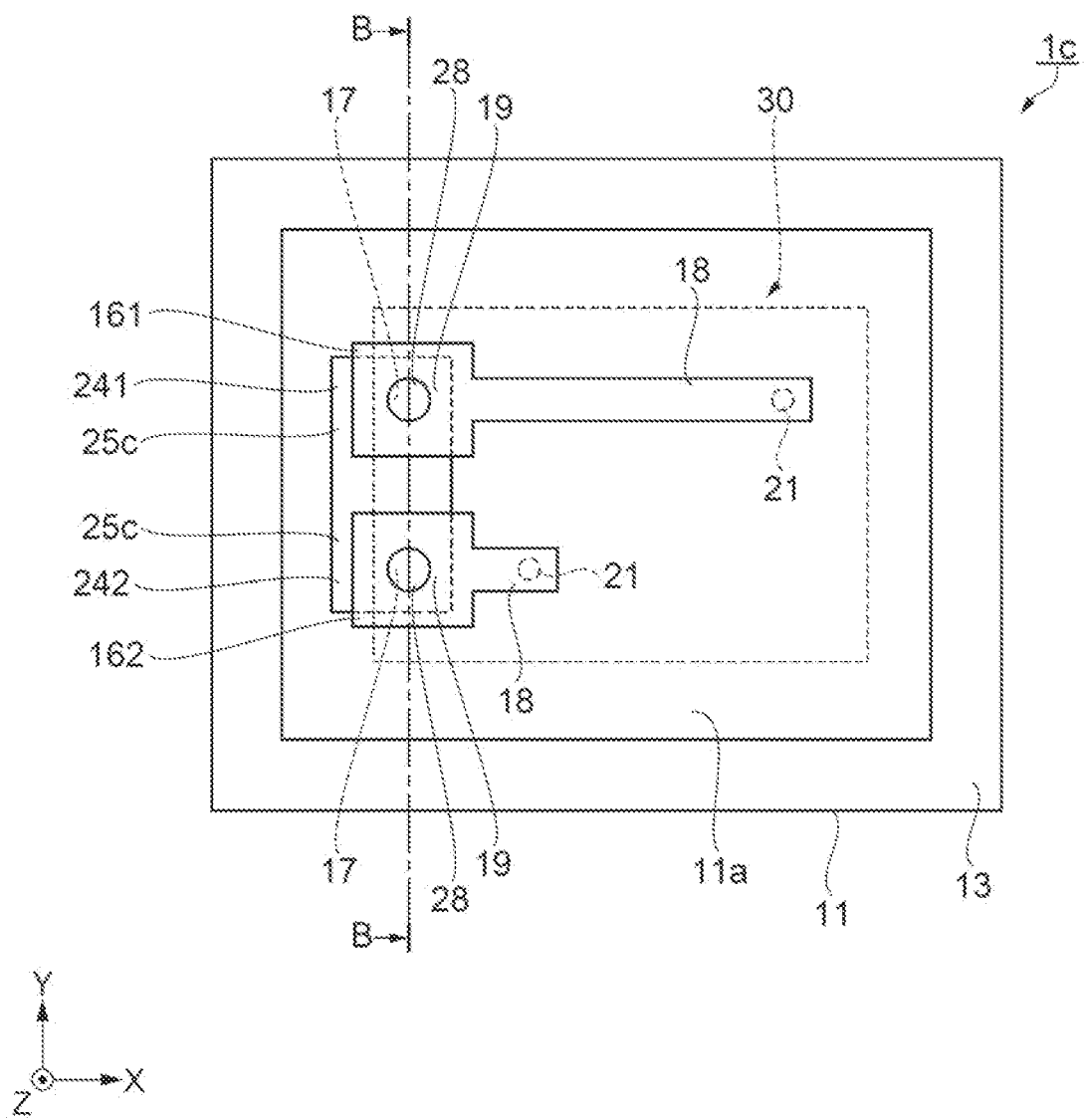
FIG. 6 is a plan view showing a schematic structure of a resonator device according to a fourth embodiment.

Next, a resonator device 1c according to a fourth embodiment will be described with reference to FIGS. 6 and 7. FIG. 6 shows a state in which the lid 12 and the resonator element 30 are removed for convenience of description of an internal configuration of the resonator device 1c.

As compared to the resonator device 1 according to the first embodiment, the resonator device 1c according to the present embodiment is the same as the resonator device 1 according to the first embodiment except that a first stress relaxation layer 241 and a second stress relaxation layer 242 are integrated, and exposed portions 25c of the first stress relaxation layer 241 and the second stress relaxation layer 242 are disposed between a first conductive layer 161 and a second conductive layer 162. Differences from the first embodiment described above will be mainly described, the same elements will be denoted by the same reference numerals, and description thereof will be omitted.

Figure 7:
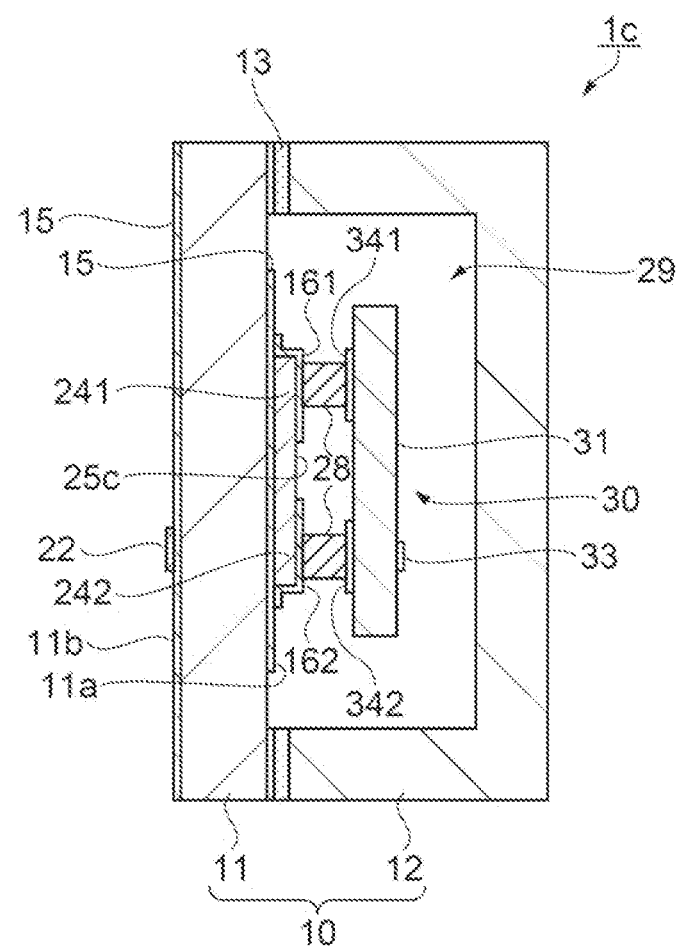
FIG. 7 is a cross-sectional view taken along a line B-B in FIG. 6.

As shown in FIGS. 6 and 7, the resonator device 1c includes the first conductive layer 161 joined to a first electrode 341 via the conductive member 28, the second conductive layer 162 joined to a second electrode 342 via the conductive member 28, the first stress relaxation layer 241 interposed between the base 11 and the first conductive layer 161, and the second stress relaxation layer 242 interposed between the base 11 and the second conductive layer 162. The first stress relaxation layer 241 and the second stress relaxation layer 242 are integrated. The exposed portions 25c of the first stress relaxation layer 241 and the second stress relaxation layer 242 are located between the first conductive layer 161 and the second conductive layer 162.

With such a configuration, the stress relaxation layers 241 and 242 can be easily manufactured and can be further miniaturized, and the same effect as that of the resonator device 1 according to the first embodiment can be achieved.

5. Fifth Embodiment

Figure 8:
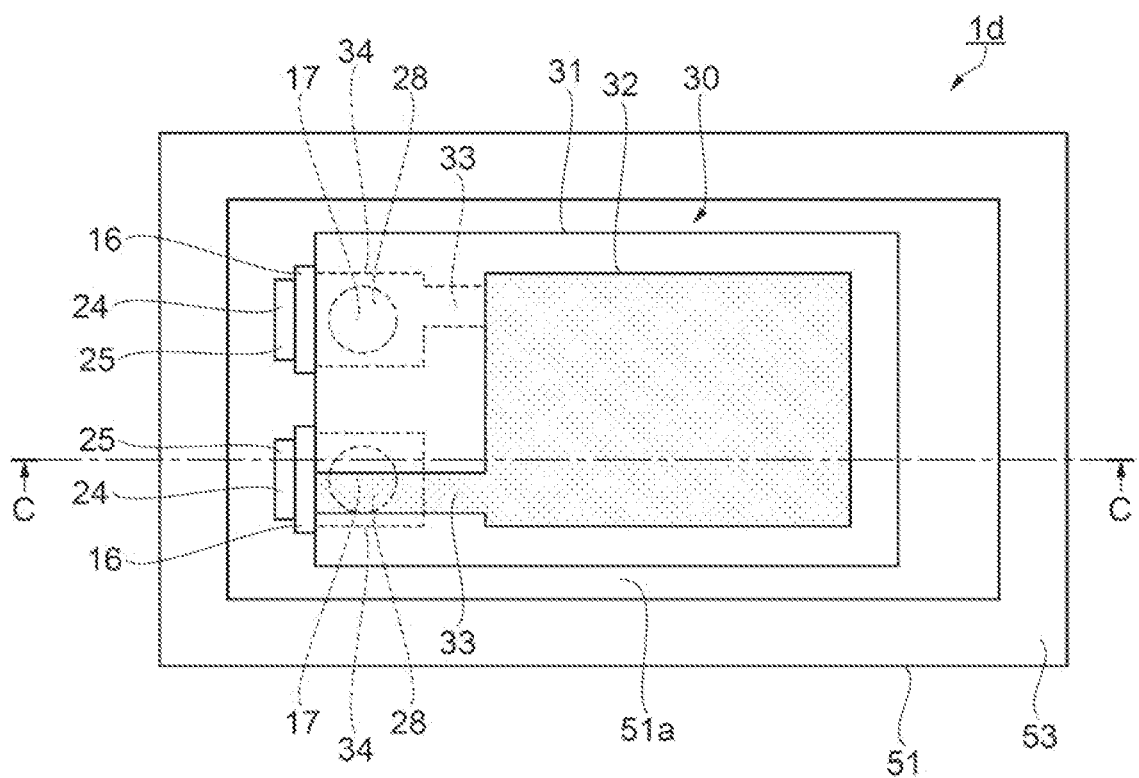
FIG. 8 is a plan view showing a schematic structure of a resonator device according to a fifth embodiment.

Next, as an example of a resonator device 1d according to a fifth embodiment, an oscillator including an oscillation circuit 67 that oscillates the resonator element 30 will be described with reference to FIGS. 8, 9, and 10. FIG. 8 shows a state in which a lid 52 is removed for convenience of description of an internal configuration of the resonator device 1d. FIG. 10 shows a state in which the lid 52 and the resonator element 30 are removed for convenience of description of the internal configuration of the resonator device 1d.

As compared to the resonator device 1 according to the first embodiment, the resonator device 1d according to the present embodiment is the same as the resonator device 1 according to the first embodiment except that an integrated circuit 66 including the oscillation circuit 67 is formed at a second surface 51b of a base 51. Differences from the first embodiment described above will be mainly described, the same elements will be denoted by the same reference numerals, and description thereof will be omitted.

Figure 9:
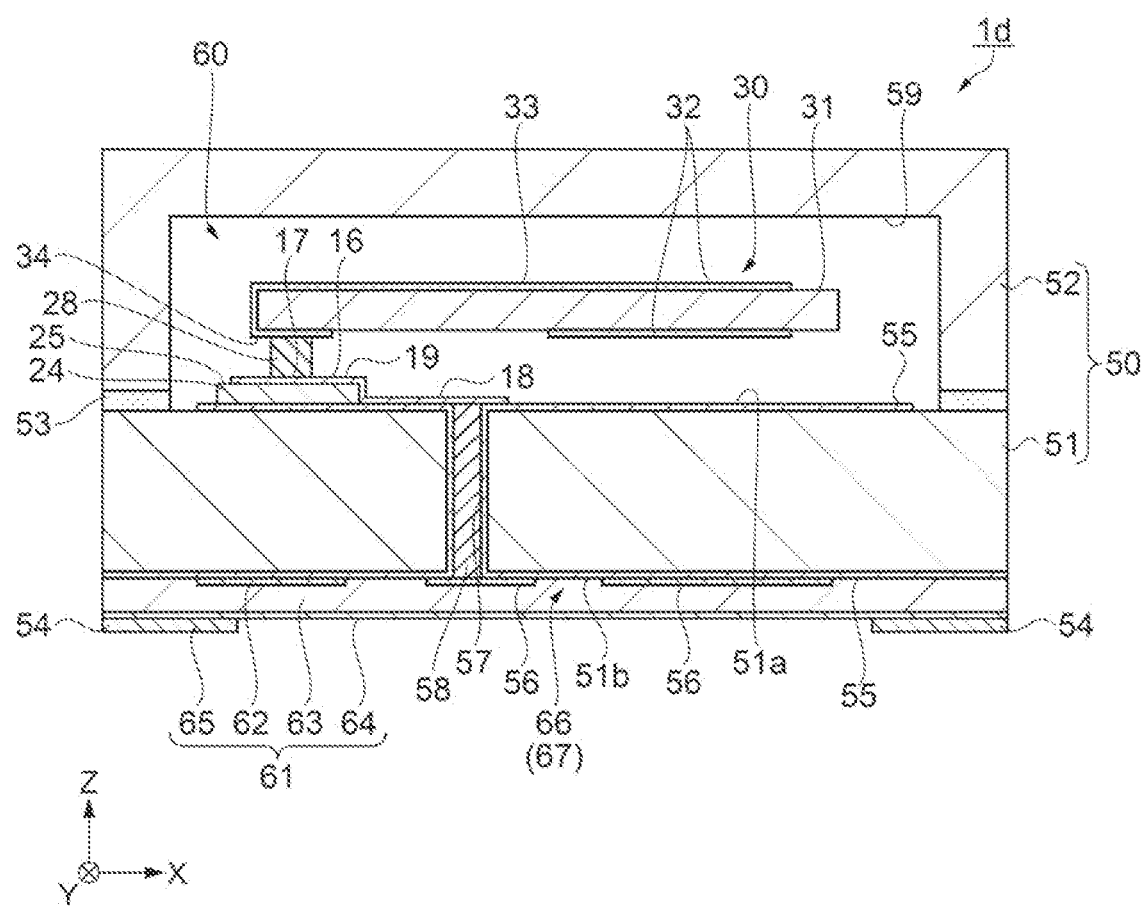
FIG. 9 is a cross-sectional view taken along a line C-C in FIG. 8.

As shown in FIGS. 8 and 9, the resonator device 1d includes a package 50 that includes the base 51 and the lid 52 joined to the base 51 via a joining member 53, and the resonator element 30 housed in an internal space 60 of the package 50.

The base 51 and the lid 52 are semiconductor substrates containing single crystal silicon, and in particular, are silicon substrates in the present embodiment. The base 51 and the lid 52 are not particularly limited, and semiconductor substrates other than the silicon substrates, for example, semiconductor substrates such as germanium substrates, gallium arsenide substrates, gallium phosphide substrates, gallium nitride substrates, or silicon carbide substrates may be used as the base 51 and the lid 52.

The base 51 is of a plate shape, and includes a first surface 51a at which the resonator element 30 is disposed, and the second surface 51b having front-back relation with the first surface 51a. Insulating films 55 are formed at surfaces of the base 51 excluding regions joined to the lid 52.

The stress relaxation layers 24 and the conductive layers 16 are laminated and disposed at the first surface 51a of the base 51, and the resonator element 30 is joined via the conductive members 28.

The integrated circuit 66 including the oscillation circuit 67 electrically coupled to the resonator element 30 is disposed at the second surface 51b of the base 51. By forming the integrated circuit 66 at the base 51, the base 51 can be effectively utilized. In particular, by forming the integrated circuit 66 at the second surface 51b, as compared with a case in which the integrated circuit 66 is formed at the first surface 51a, a wide space for forming the integrated circuit 66 can be secured since no regions joined to the lid 52 are present. However, the integrated circuit 66 may be formed at the first surface 51a of the base 51 instead of the second surface 51b of the base 51.

The integrated circuit 66 includes the oscillation circuit 67 that is electrically coupled to the resonator element 30 and that generates an oscillation signal such as a clock signal by oscillating the resonator element 30. The integrated circuit 66 may include a circuit in addition to the oscillation circuit 67. Examples of the circuit include a processing circuit that processes an output signal from the oscillation circuit 67, and examples of such a processing circuit include a PLL circuit.

A laminated body 61 in which a wiring layer 62, an insulating layer 63, a passivation film 64, and a terminal layer 65 are laminated is formed at the second surface 51b. Further, a plurality of active elements (not shown) formed at the second surface 51b are electrically coupled via wirings 56 provided in the wiring layer 62 to form the integrated circuit 66. The terminal layer 65 includes a plurality of mounting terminals 54 electrically coupled to the oscillation circuit 67. Although one wiring layer 62 is provided in the laminated body 61 in a shown configuration, the present disclosure is not limited thereto, and a plurality of wiring layers 62 may be laminated via the insulating layers 63. That is, the wiring layers 62 and the insulating layers 63 may be alternately laminated a plurality of times. Accordingly, for example, it is possible to increase a degree of freedom in arrangement of the plurality of mounting terminals 54 by routing the wirings 56 in the circuit.

The base 51 is formed with a pair of through holes 57 that penetrate the base 51 in a thickness direction. The through holes 57 are filled with a conductive material to form a through electrode 58. As shown in FIGS. 9 and 10, the conductive layers 16 electrically coupled to the resonator element 30 are disposed on the through electrode 58 on a first surface 51a side. Therefore, the conductive layers 16 can be electrically coupled to the oscillation circuit 67 via the through electrode 58, and the resonator element 30 can be oscillated.

The lid 52 is open to a base 51 side and has a bottomed recess 59 for housing the resonator element 30 inside. Further, a lower surface of the lid 52 is joined to the base 51 via the joining member 53. Accordingly, the lid 52 forms, together with the base 51, the internal space 60 for housing the resonator element 30.

The internal space 60 is airtight and is in a depressurized state, preferably a state closer to vacuum. Accordingly, viscous resistance is reduced, and oscillation characteristics of the resonator element 30 are improved. However, an atmosphere of the internal space 60 is not particularly limited, and may be, for example, an atmosphere in which an inert gas such as nitrogen or argon is sealed, or may be an atmospheric pressure state or a pressurized state instead of the depressurized state.

With such a configuration, the resonator device 1d including the oscillation circuit 67 can be miniaturized, and the same effect as that of the resonator device 1 according to the first embodiment can be achieved.

What is claimed is:

1. A resonator device comprising:
   a base having a first surface and a second surface that are in front-back relation;
   a resonator element that is located at a first surface with respect to the base and that includes a resonation substrate and an electrode disposed at a surface of the resonation substrate on a base side;
   a conductive layer that is disposed at the first surface and that includes a joint portion joined to the electrode; and
   a stress relaxation layer that is interposed between the base and the conductive layer and that at least partially overlaps with the joint portion in a plan view of the base,
   wherein the stress relaxation layer includes an exposed portion exposed from the conductive layer;
   the conductive layer includes the joint portion, a wiring portion disposed at the first surface, and a coupling portion that couples the joint portion and the wiring portion;
   the coupling portion includes a first coupling portion extending to a plus side in a first direction and a second coupling portion extending to a minus side in the first direction; and
   the coupling portion further includes a third coupling portion extending to a plus side in a second direction intersecting with the first direction, and a fourth coupling portion extending to a minus side in the second direction.

2. The resonator device according to claim 1, wherein the stress relaxation layer is formed of a resin material.

3. The resonator device according to claim 1, wherein the electrode includes a first electrode and a second electrode,
   the conductive layer includes a first conductive layer joined to the first electrode and a second conductive layer joined to the second electrode,
   the stress relaxation layer includes a first stress relaxation layer interposed between the base and the first conductive layer, and a second stress relaxation layer interposed between the base and the second conductive layer, and
   the first stress relaxation layer and the second stress relaxation layer are integrated.

4. The resonator device according to claim 1, further comprising:
   an oscillation circuit that is disposed at the second surface and that is electrically coupled to the resonator element.

* * * * *